Figure 1:
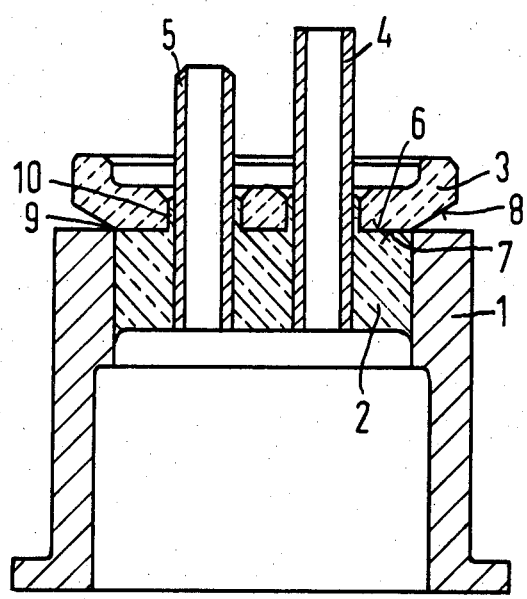

United States Patent [19]

Vogt et al.

[11] 4,292,464
[45] Sep. 29, 1981

[54] GLASS PASS THROUGH WITH AN ADDITIONAL INSULATOR FOR LENGTHENING LEAKAGE PATH

[75] Inventors: Herbert Vogt; Lothar Wassill; Christian Wengler, all of Munich, Fed. Rep. of Germany

[73] Assignee: Siemens Aktiengesellschaft, Berlin & Munich, Fed. Rep. of Germany

[21] Appl. No.: 973,529

[22] Filed: Dec. 26, 1978

[30] Foreign Application Priority Data

Jan. 9, 1978 [DE] Fed. Rep. of Germany ....... 2800696

[51] Int. Cl.³ ................. H01B 17/26; H01L 23/02
[52] U.S. Cl. ...................... 174/152 GM; 174/50.61; 65/59 B
[58] Field of Search ............... 174/50.56, 50.58, 50.59, 174/50.61, 50.63, 52 H, 152 GM; 65/59 R, 59 B, 42, 138, 139, 154, 155; 403/179; 357/74

[56] References Cited

U.S. PATENT DOCUMENTS

| | | | |
|---|---|---|---|
| 2,079,354 | 5/1937 | Knowles | 174/152 GM X |
| 2,174,375 | 9/1939 | Beggs | 174/50.56 X |
| 2,458,748 | 1/1949 | Stupakoff | 174/152 GM |
| 3,331,913 | 7/1967 | Johnson | 174/52 GM X |

FOREIGN PATENT DOCUMENTS

| | | | |
|---|---|---|---|
| 879739 | 6/1953 | Fed. Rep. of Germany | 65/59 B |
| 1439099 | 1/1969 | Fed. Rep. of Germany | 174/152 GM |
| 1439128 | 10/1969 | Fed. Rep. of Germany | 174/52 H |

Primary Examiner—Laramie E. Askin
Attorney, Agent, or Firm—Herbert L. Lerner

[57] ABSTRACT

Pass through having a glass part disposed in an opening formed in a metal case part, an insulator for lengthening the leakage path connected at an end face thereof to at least one end face of the glass part and at least one electric conductor extending through the glass part and the insulator, the connection between the insulator and the glass part including a fused glass junction.

2 Claims, 2 Drawing Figures

GLASS PASS THROUGH WITH AN ADDITIONAL INSULATOR FOR LENGTHENING LEAKAGE PATH

The present invention relates to a pass through or header with a glass part which is disposed in an opening formed in a metal housing part, with an additional insulator and a fused connection between the material of at least one of the end faces of the glass part and an end face of the insulator, and with at least one electric conductor which passes through the glass part and the insulator.

Such a pass through has been described, for instance, in German Published, Non-Prosecuted Application DTOS No. 1 439 099. The additional insulator is provided for the purpose of lengthening the leakage path between the metal case of a semiconductor component and a lead for the semiconductor body coming out of the housing. This construction is used because the leakage path of a glass feedthrough alone, being a fused-glass pass through or a pressed-glass pass through, may be too short it if is to be used for high voltage.

To lengthen the leakage path effectively, the additional insulator must be connected by fusing to the glass part. In the known pass through, the insulator was connected to the glass part by means of an adhesive substance i.e. cemented or glued.

This type of connection, however, was found not to be resistant to temperature cycles. It is therefore an object of the present invention to provide a glass pass through which overcomes the above-mentioned shortcomings of heretofore known devices of this type so that it is resistant to temperature cycles.

With the foregoing and other objects in view, there is provided in accordance with the invention, a pass through having a glass part disposed in an opening formed in a metal case part, an additional insulator having a fused connection at an end face thereof to at least one end face of the glass part, and at least one electric conductor extending through the glass part and the insulator, the fused connection between the insulator and the glass part comprising a vitreous fused glass junction.

In acccordance with another feature of the invention, the insulator is a ceramic ring.

In accordance with a further feature of the invention, the ceramic ring and the glass part are round and are disposed concentrically with respect to each other.

In accordance with an additional feature of the invention, the end face of the ceramic ring facing the glass part is bevelled so that a capillary gap is formed for the fused-glass junction.

In accordance with a concomitant feature of the invention, the pass through is used in cases for power semiconductor components.

Other features which are considered as characteristic for the invention are set forth in the appended claims.

Although the invention is illustrated and described herein as embodied in a glass pass through, it is nevertheless not intended to be limited to the details shown, since various modifications and structural changes may be made therein without departing from the spirit of the invention and within the scope and range of equivalents of the claims.

Figure 2:
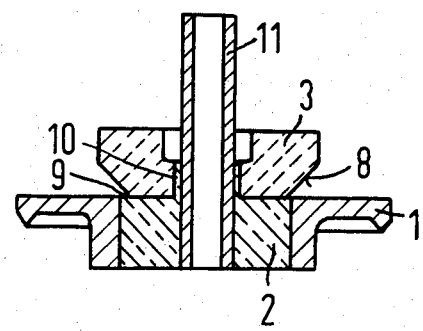

The construction and method of operation of the invention, however, together with additional objects and advantages thereof will be best understood from the following description of specific embodiments when read in connection with the accompanying drawings in which:

FIG. 1 is a diagrammatic cross-sectional view of an upper housing part of a semiconductor component with a pass through for two conductors; and FIG. 2 is a diagrammatic cross-sectional view of a pass through with one conductor.

Referring now to the figures of the drawing and, first, particularly to FIG. 1 thereof, there is shown a metal housing part 1, which is part of a semiconductor component. It can be constructed, for instance, of steel. The pass through or header includes a glass part 2, in which the conductors 4 and 5 are seated. On the glass part 2 is mounted an insulator 3, which may be, for instance, a ceramic ring. One of the end faces 6, of the insulator 3 is fused to the end face 7 of the glass part 2. The end face 6 of the insulator 3 is provided with a bevel 8, so that the diameter of the insulator 3 at its end face 6 is smaller than the diameter of the glass part 2. Thus, the bevel 8, in the unmelted state, forms a capillary gap 9 with the glass part 2. The insulator 3 has openings formed therein, the diameter of which are larger than the outside diameter of the conductors 4, 5, by such a distance that the space 10 between these conductors and the surfaces of the openings formed in the insulator 3 can be filled with glass.

The individual parts of the pass through or lead through are fused together in a mold. For this purpose, the parts are assembled as shown in FIG. 1 and are placed upside down in a mold, which may be formed, for instance, of graphite. When the glass part 2 melts, it makes a joint with the metal case part 1, the conductors 4, 5, and the insulator 3. The glass then flows into the capillary gap 9 and partly into the space 10 and thus provides a hermetically sealed and mechanically strong joint between the individual parts of the pass through.

The conductors 4, 5, are shown as metal tubes in the drawings. For electrically connecting the semiconductor body in the interior of the housing, wires, cables or screws are pushed through the tubes and are gas-tightly joined to the tubes by pinching, crimping, soldering or welding. However, it is also possible to fuse-in the wires, cables or screws directly instead of the conductors 4, 5.

The insulator and the glass part are advantageously constructed with a round shape and are disposed concentrically with respect to each other. This results in an optimal lengthening of the leakage path.

In FIG. 2, a pass through with only one conductor 11 is shown. Like parts or parts with the same function as in FIG. 1 are provided with the same reference numerals in FIG. 2. The metal case part 1 in FIG. 2 has the form of a welding ring which is placed on the rim of an opening of another metal case part for a semiconductor component, for instance, and is welded thereto. The pass through according to FIG. 2 can be formed in the same manner as the pass through according to FIG. 1.

It is advantageous to construct the insulator 3 as a glass-fusing mold. In both the embodiments of FIGS. 1 and 2, the volume of the glass part must be chosen to be large enough so that complete wetting between the melted glass and the end face of the insulator is ensured.

The use of the pass through is not limited to semiconductor components. They can be employed in all kinds of equipment where glass pass throughs or penetrators for relatively high voltages must be used.

There is claimed:

1. A power semiconductor component, comprising a glass part having at least one end face, a metal case part having an opening formed therein in which said glass part is disposed and sealed to said metal case part, a ceramic ring having a planar end face and an outer diameter which is larger than the opening in said metal case part, said ceramic ring being connected at said end face thereof to said at least one end face of said glass part, at least one electric conductor extending through said glass part and an opening formed in said ceramic ring, said at least one electric conductor having an outside diameter which is smaller than the diameter of the opening in said ceramic ring forming a space therebetween, and glass disposed in said space sealing said glass part and said ceramic part to said at least one electric conductor, said connection between said ceramic ring and said glass part comprising a glass fusion-melt, said end face of said ceramic ring connected to said glass part having a bevel formed at the periphery thereof extended beyond the opening in said metal case part, forming a capillary gap for said glass fusion-melt and leaving a diameter inside said bevel at the periphery which is smaller than the diameter of the opening in said metal case part.

2. A power semiconductor component according to claim 1 wherein said ceramic ring and said glass part are circular and are mutually concentrically disposed.

* * * * *